(12) United States Patent
Ohashi et al.

(10) Patent No.: US 7,074,624 B2
(45) Date of Patent: Jul. 11, 2006

(54) FERROELECTRIC FILM, METHOD OF MANUFACTURING FERROELECTRIC FILM, FERROELECTRIC CAPACITOR, METHOD OF MANUFACTURING FERROELECTRIC CAPACITOR, AND FERROELECTRIC MEMORY

(75) Inventors: Koji Ohashi, Chino (JP); Takeshi Kijima, Matsumoto (JP); Junichi Karasawa, Shimosuwa-machi (JP); Yasuaki Hamada, Suwa (JP); Eiji Natori, Chino (JP)

(73) Assignee: Seiko Epson Corporation, Tokyo (JP)

( * ) Notice: Subject to any disclaimer, the term of this patent is extended or adjusted under 35 U.S.C. 154(b) by 58 days.

(21) Appl. No.: 10/808,417

(22) Filed: Mar. 25, 2004

(65) Prior Publication Data

US 2004/0248360 A1 Dec. 9, 2004

(30) Foreign Application Priority Data

Mar. 26, 2003 (JP) .............................. 2003-085784

(51) Int. Cl.
*H01L 21/00* (2006.01)
*H01L 21/8242* (2006.01)

(52) U.S. Cl. .......................... 438/3; 438/240; 438/393; 438/396; 438/785

(58) Field of Classification Search ................. 438/3, 438/240, 393, 396, 785
See application file for complete search history.

(56) References Cited

U.S. PATENT DOCUMENTS

| 5,138,520 | A | | 8/1992 | McMillan et al. ........... 361/311 |
|---|---|---|---|---|
| 5,851,841 | A | * | 12/1998 | Ushikubo et al. ............ 438/240 |
| 6,090,443 | A | | 7/2000 | Eastep .................... 427/255.32 |
| 6,150,183 | A | | 11/2000 | Fukuda et al. .................. 438/3 |
| 6,159,868 | A | | 12/2000 | Hieda et al. ................. 438/778 |
| 6,162,744 | A | * | 12/2000 | Al-Shareef et al. .......... 438/785 |
| 6,287,637 | B1 | | 9/2001 | Chu et al. ................. 427/376.2 |
| 6,498,044 | B1 | * | 12/2002 | Park .............................. 438/3 |
| 2002/0110934 | A1 | | 8/2002 | Uchiyama et al. .............. 438/3 |
| 2002/0197793 | A1 | | 12/2002 | Dornfest et al. ............. 438/253 |
| 2003/0001177 | A1 | * | 1/2003 | Okutoh et al. ............... 257/295 |

* cited by examiner

*Primary Examiner*—Mary Wilczewski
*Assistant Examiner*—Toniae M. Thomas
(74) *Attorney, Agent, or Firm*—Oliff & Berridge, PLC

(57) ABSTRACT

A method of manufacturing a ferroelectric film includes crystallizing a raw material having a complex oxide, the method including: performing a heat treatment in a first condition in which a predetermined pressure and a predetermined temperature are applied; and maintaining a second condition, in which a pressure and a temperature lower than the pressure and the temperature in the first condition are applied, after the heat treatment in the first condition, and the raw material is crystallized by repeating the heat treatment in the first condition and the maintaining the second condition.

14 Claims, 10 Drawing Sheets

A-A

FERROELECTRIC FILM, METHOD OF MANUFACTURING FERROELECTRIC FILM, FERROELECTRIC CAPACITOR, METHOD OF MANUFACTURING FERROELECTRIC CAPACITOR, AND FERROELECTRIC MEMORY

Japanese Patent Application No. 2003-85784, filed on Mar. 26, 2003, is hereby incorporated by reference in its entirety.

BACKGROUND OF THE INVENTION

The present invention relates to a ferroelectric film, a method of manufacturing a ferroelectric film, a ferroelectric capacitor, a method of manufacturing a ferroelectric capacitor, and a ferroelectric memory.

As a ferroelectric film applied to semiconductor devices (ferroelectric memory (FeRAM), for example), a ferroelectric film having a perovskite structure (PbZrTiO, for example) and a ferroelectric film having a layered perovskite structure (BiLaTiO, BiTiO, or SrBiTaO, for example) have been proposed.

Pb or Bi contained in the material for the ferroelectric film easily volatilizes at low temperature due to high vapor pressure. Since a high-temperature heat treatment is performed during the crystallization process of the ferroelectric film, Pb or Bi bonds to oxygen in the atmosphere necessary for crystallization of the ferroelectric and is released, thereby adversely affecting the characteristics of the crystallized ferroelectric film.

In recent years, the degree of miniaturization and integration of the semiconductor device has been increased. Therefore, a reduction of the thickness of the ferroelectric film has been demanded. However, it is difficult to form a thin ferroelectric film having excellent characteristics by using conventional manufacturing steps.

BRIEF SUMMARY OF THE INVENTION

The present invention may provide a method of manufacturing a ferroelectric film having excellent characteristics and a ferroelectric film obtained by this manufacturing method. The present invention may also provide a method of manufacturing a ferroelectric capacitor and a ferroelectric capacitor obtained by this manufacturing method. The present invention may also provide a ferroelectric memory to which the ferroelectric film or the ferroelectric capacitor of the present invention is applied.

A method of manufacturing a ferroelectric film according one aspect of the present invention includes crystallizing a raw material having a complex oxide, the method including:

performing a heat treatment in a first condition in which a predetermined pressure and a predetermined temperature are applied; and maintaining a second condition, in which a pressure and a temperature lower than the pressure and the temperature in the first condition are applied, after the heat treatment in the first condition, wherein the raw material is crystallized by repeating the heat treatment in the first condition and the maintaining the second condition.

A ferroelectric film according to another aspect of the present invention is manufactured by the above method of manufacturing a ferroelectric film, whereby a ferroelectric film having an excellent crystal structure can be provided.

A ferroelectric memory according to a further aspect of the present invention has the above ferroelectric film.

A method of manufacturing a ferroelectric capacitor according to a still further aspect of the present invention includes:

forming a lower electrode on a body;

forming a ferroelectric film on the lower electrode by crystallizing a raw material including a complex oxide; and forming an upper electrode on the ferroelectric film, wherein the crystallization includes:

performing a first heat treatment in a first condition in which a predetermined pressure and a predetermined temperature are applied; and maintaining a second condition, in which a pressure and a temperature lower than the pressure and the temperature in the first condition are applied, after the heat treatment in the first condition, wherein the heat treatment in the first condition and the maintaining the second condition are repeated.

A ferroelectric capacitor according to an even further aspect of the present invention is manufactured by the above method of manufacturing a ferroelectric capacitor.

A ferroelectric memory according to a yet further aspect of the present invention includes the above ferroelectric capacitor.

DETAILED DESCRIPTION OF THE EMBODIMENT

Figure 1A:
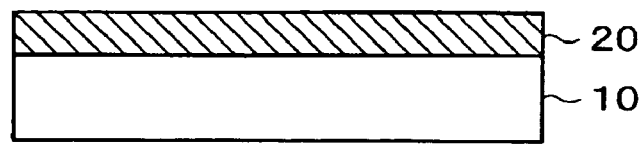
FIG. 1 shows manufacturing steps of a ferroelectric capacitor according to an embodiment of the present invention.

Embodiments of the present invention are described below.

A method of manufacturing a ferroelectric film according to one embodiment of the present invention includes crystallizing a raw material having a complex oxide, the method including:

performing a heat treatment in a first condition in which a predetermined pressure and a predetermined temperature are applied; and maintaining a second condition, in which a pressure and a temperature lower than the pressure and the temperature in the first condition are applied, after the heat treatment in the first condition, wherein the raw material is crystallized by repeating the heat treatment in the first condition and the maintaining the second condition.

According to this method of manufacturing a ferroelectric film, the raw material can be crystallized by repeating the step of performing a heat treatment in the first condition in which a predetermined pressure and a predetermined temperature is applied and the step of maintaining the second condition in which a pressure and a temperature lower than the pressure and the temperature in the first condition is applied. A stress applied to the raw material can be reduced by crystallizing the raw material by using such an intermittent heat treatment in comparison with the case of performing a continuous heat treatment. As a result, a ferroelectric film with excellent crystallization state can be formed. The present invention is particularly effective when forming a thin ferroelectric film with a thickness of 10 to 150 nm, whereby a thin ferroelectric film having excellent characteristics can be formed.

This method of manufacturing a ferroelectric film may include the following features.

With this method, the heat treatment in the first condition may be performed at a pressure at two atmospheres or more and in an atmosphere containing oxygen at a volume ratio of 10% or less.

According to this feature, vaporization of the metal material (Pb or Bi, for example) included in the raw material can be prevented by applying a pressure at two atmospheres or more, and the metal material can be prevented from bonding to oxygen by limiting the amount of oxygen contained in the atmosphere at a volume ratio of 10% or less. Therefore, a ferroelectric film having an excellent crystallization state can be obtained.

With this method, the heat treatment in the first condition may be performed at a pressure of two atmospheres or more using a rapid thermal annealing method.

According to this feature, vaporization of the metal material (Pb or Bi, for example) included in the raw material due to a high-temperature heat treatment can be prevented by applying a pressure at two atmospheres or more. The crystal plane of the ferroelectric film tends to be oriented at random if the temperature is increased at a low rate during the heat treatment for crystallization, since the initial crystal nuclei are generated at various angles. According to this feature, a highly oriented ferroelectric film can be obtained by performing the heat treatment using the rapid thermal annealing method in which the raw material is rapidly heated at 50° C. degrees per second or more.

With this method, the heat treatment in the first condition may be performed in an atmosphere containing oxygen at a volume ratio of 10% or less.

According to this feature, the metal material included in the raw material can be prevented from bonding to oxygen by performing the heat treatment in the first condition in an atmosphere containing oxygen at a volume ratio of 10% or less. Therefore, a ferroelectric film having a further excellent crystallization state can be obtained.

With this method, the heat treatment in the first condition may include applying a pressure at two atmospheres or more at least before raising a temperature.

According to this feature, vaporization of the metal material (Pb or Bi, for example) included in a complex oxide in a low temperature region of the heat treatment can be effectively prevented by increasing the pressure of the atmosphere during the crystallization process before raising the temperature.

A ferroelectric film according to another embodiment of the present invention is manufactured by the above method of manufacturing a ferroelectric film, whereby a ferroelectric film having an excellent crystal structure can be provided.

A ferroelectric memory according to a further embodiment of the present invention has the above ferroelectric film.

A method of manufacturing a ferroelectric capacitor according to a still further embodiment of the present invention includes:

forming a lower electrode on a body;

forming a ferroelectric film on the lower electrode by crystallizing a raw material including a complex oxide; and forming an upper electrode on the ferroelectric film, wherein the crystallization includes:

performing a first heat treatment in a first condition in which a predetermined pressure and a predetermined temperature are applied; and maintaining a second condition, in which a pressure and a temperature lower than the pressure and the temperature in the first condition are applied, after the heat treatment in the first condition, wherein the heat treatment in the first condition and the maintaining the second condition are repeated.

According to this method of manufacturing a ferroelectric capacitor, the raw material is crystallized by using an intermittent heat treatment. Therefore, a stress applied to the raw material can be reduced in comparison with the case of performing a continuous heat treatment. As a result, a ferroelectric film with excellent crystallization state can be formed. The present invention is particularly effective when forming a ferroelectric capacitor including a thin ferroelectric film with a thickness of 10 to 150 nm, whereby a ferroelectric capacitor including a thin ferroelectric film having excellent characteristics can be formed thereby contributing to a high integration of semiconductor devices.

This method of manufacturing a ferroelectric capacitor may include the following features.

With this method, the first heat treatment in the first condition may be performed at a pressure at two atmospheres or more and in an atmosphere containing oxygen at a volume ratio of 10% or less.

According to this feature, vaporization of the metal material (Pb or Bi, for example) included in the raw material can be prevented by applying a pressure at two atmospheres or more, and the metal material can be prevented from bonding to oxygen by limiting the amount of oxygen contained in the atmosphere at a volume ratio of 10% or less. Therefore, a ferroelectric capacitor including a ferroelectric film having an excellent crystallization state can be obtained.

With this method, the first heat treatment in the first condition may be performed at a pressure of two atmospheres or more using a rapid thermal annealing method.

According to this feature, vaporization of the metal material (Pb or Bi, for example) included in the raw material due to a high-temperature heat treatment can be prevented by applying a pressure at two atmospheres or more. The crystal plane of the ferroelectric film tends to be oriented at random if the temperature is increased at a low rate during the heat treatment for crystallization, since the initial crystal nuclei are generated at various angles. According to this feature, a highly oriented ferroelectric film can be obtained by performing the heat treatment using the rapid thermal annealing method in which the raw material is rapidly heated at 50° C. degrees per second or more.

With this method, the first heat treatment in the first condition may be performed in an atmosphere containing oxygen at a volume ratio of 10% or less.

According to this feature, the metal material included in the raw material can be prevented from bonding to oxygen by performing the heat treatment in the first condition in an atmosphere containing oxygen at a volume ratio of 10% or less. Therefore, a ferroelectric film having a further excellent crystallization state can be obtained.

With this method, the first heat treatment in the first condition may include applying a pressure at two atmospheres or more at least before raising a temperature.

According to this feature, vaporization of the metal material (Pb or Bi, for example) included in the complex oxide in a low temperature region of the heat treatment can be effectively prevented by increasing the pressure of the atmosphere during the crystallization process before raising the temperature.

With this method, a second heat treatment, in which a temperature higher than the temperature in the first condition is applied, may be performed at least after forming the upper electrode.

According to this feature, the heat treatment is performed at a temperature higher than the crystallization temperature after forming a ferroelectric capacitor structure on the substrate. This improves the interfacial state between the ferroelectric film and the upper electrode and the interfacial state between the ferroelectric film and the lower electrode, and promotes crystal growth from the side of the upper electrode, whereby a ferroelectric capacitor including a ferroelectric film having a further excellent crystal structure can be manufactured.

With this method, the second heat treatment may be performed at a pressure of two atmospheres or more.

With this method of manufacturing a ferroelectric capacitor, the second heat treatment may be performed by using a rapid thermal annealing method.

With this method of manufacturing a ferroelectric capacitor, the second heat treatment may be performed in an atmosphere containing oxygen at a volume ratio of 10% or less.

A ferroelectric capacitor according to an even further embodiment of the present invention is manufactured by the above method of manufacturing a ferroelectric capacitor.

A ferroelectric memory according to a yet further embodiment of the present invention includes the above ferroelectric capacitor.

A ferroelectric film, a method of manufacturing a ferroelectric film, a ferroelectric capacitor, a method of manufacturing a ferroelectric capacitor, and a ferroelectric memory according to the embodiment of the present invention are described below in more detail.

1. Method of Manufacturing Ferroelectric Capacitor

FIGS. 1A to 1D are cross-sectional views schematically showing manufacturing steps of a ferroelectric capacitor according to the present embodiment.

(1) As shown in FIG. 1A, a lower electrode 20 is formed on a substrate 10. The lower electrode 20 may be formed of material such as a metal (Pt, Ir, Al, Au, Ag, Ru, or Sr, for example), an oxide conductor ($IrO_x$, for example), or a nitride conductor (TiN, for example) by using a sputtering method. The lower electrode 20 may be either a single-layer film or a stacked multilayer film.

Figure 1B:
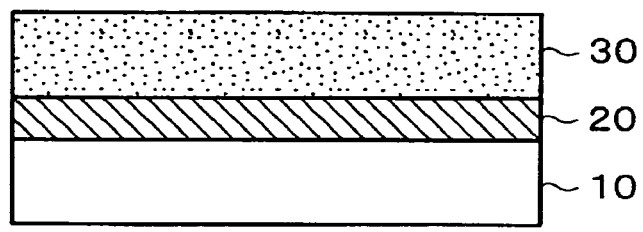

(2) As shown in FIG. 1B, a raw material 30 including a complex oxide is formed on the lower electrode 20. As a method for forming the raw material 30, a coating method and an LSMCD method can be given. As examples of the coating method, a spin coating method and a dipping method can be given. The raw material 30 preferably includes a sol-gel raw material and an MOD raw material.

In the raw material 30, the sol-gel raw material and the MOD raw material may be adjusted to the stoichiometric composition of the complex oxide, and the mixture of the raw materials may include the metal material (Pb or Bi, for example) included in the complex oxide in an amount of at most 5% in excess of the stoichiometric composition. For example, since the metal material such as Pb or Bi bonds to oxygen at low temperature and vaporizes, 10 to 20% of Bi or Pb is included in the raw material 30 as an excess additive in a conventional method in order to compensate for shortages during the crystallization process.

The raw material 30 is dried and presintered, if necessary.

Figure 1C:
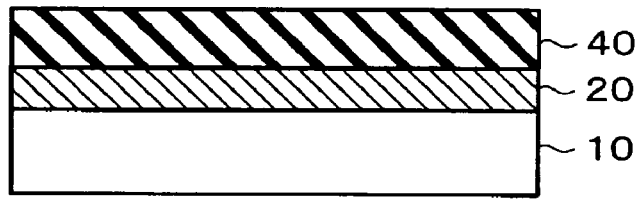
Figure 2:
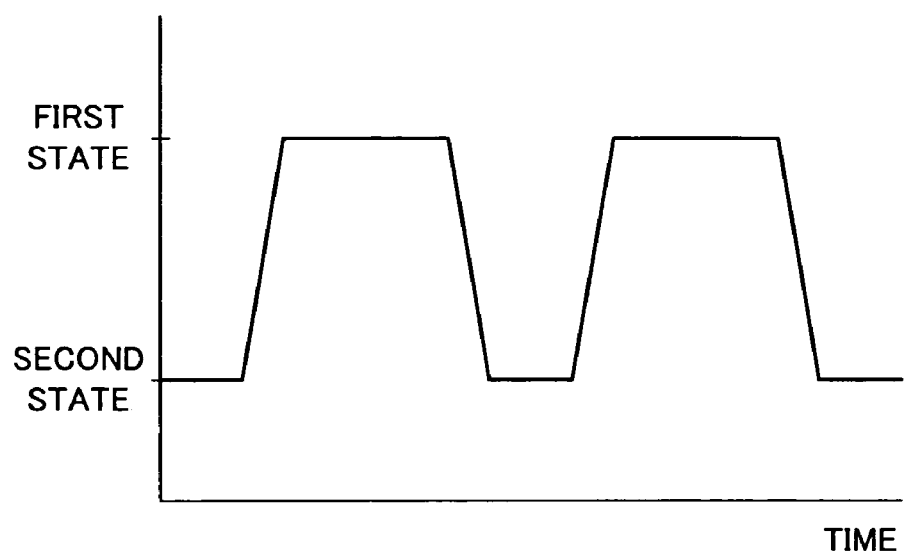
FIG. 2 shows a crystallization step of a ferroelectric film according to this embodiment of the present invention.

(3) As shown in FIG. 1C, the raw material 30 is crystallized by subjecting the raw material 30 to a heat treatment to form a ferroelectric film 40. As shown in FIG. 2, the raw material 30 is crystallized by repeating (a) a step of performing a heat treatment in a first condition, in which a predetermined pressure and a predetermined temperature is applied, and (b) a step of maintaining a second condition, in which a pressure and a temperature lower than that in the first condition is applied, after the step (a). The steps (a) and (b) may be repeatedly performed a plurality of times, if necessary. The step (a) is not necessarily performed a plurality of times at the same pressure and temperature conditions. For example, the second step (a) may be performed at a temperature higher than the temperature in the first step (a).

The step (a) is described below. The heat treatment in the step (a) is performed in an atmosphere at a pressure of two atmospheres or more and a temperature at which the raw material creates a network of inorganic oxides, and preferably 400 to 700° C. In the heat treatment in the step (a), the temperature raising process is preferably performed at a pressure of two atmospheres or more in a low temperature region of 100° C. or less. It is known that Pb in a PbZrTiO (hereinafter called "PZT") complex oxide bonds to oxygen at a comparatively low temperature and is easily released into the atmosphere (see "Handbook for Electrochemistry", fourth edition, page 128, Maruzen, 1985), for example. The manufacturing method of the present embodiment aims at preventing such a metal material from being released into the atmosphere. In the heat treatment, the atmosphere may be pressurized at two atmospheres or more before raising the temperature.

In the present embodiment, since the metal material can be prevented from bonding to oxygen and being released by performing the heat treatment in an atmosphere containing oxygen at a volume ratio of 10% or less, the effect of preventing release of the metal material due to pressurization can be further increased.

The heat treatment in the step (a) may be performed by using a rapid thermal annealing method, for example. A highly oriented ferroelectric film can be obtained by performing the heat treatment using the rapid thermal annealing method in which the raw material is rapidly heated at 50° C. degrees per second or more.

In this heat treatment, the temperature raising process may be performed at a pressure higher than atmospheric pressure, and the temperature lowering process may be performed at a pressure lower than the pressurized state. This prevents the metal material from being released from the raw material due to pressurization during the temperature raising process, and prevents impurities such as an excess material contained in the atmosphere from adhering to the ferroelectric film and an affected layer from being formed in the ferroelectric film in the temperature lowering process by reducing the pressure from the pressurized state.

The step (b) is described below. In the step (b), it suffices that the pressure in the second condition be lower than the pressure in the first condition. The pressure in the second condition is preferably atmospheric pressure. It suffices that the temperature in the second condition be lower than the temperature in the first condition. The temperature in the second condition is preferably the Curie point or less of the material, and still more preferably from room temperature to 200° C.

Figure 1D:
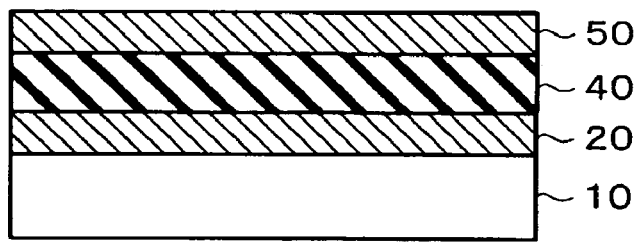

(4) As shown in FIG. 1D, an upper electrode 50 is formed on the ferroelectric film 40 to obtain a ferroelectric capacitor. As the material and the formation method for the upper electrode 50, the material and the formation method for the lower electrode 20 may be applied.

The method of the present embodiment is also effective for crystallization of a complex oxide including Bi, which bonds to oxygen in a low temperature region and is easily released into the atmosphere in the same manner as Pb, such as BiLaTiO (hereinafter called "BLT"), BiTiO (hereinafter called "BIT"), or SrBiTaO (hereinafter called "SBT") complex oxide.

As described above, according to the method of manufacturing a ferroelectric capacitor according to the present embodiment, the raw material can be crystallized by repeatedly performing the steps (a) and (b). Specifically, in the manufacturing method of the present embodiment, the raw material is crystallized by performing an intermittent heat treatment instead of a continuous heat treatment. Therefore, a strain occurring in the raw material can be reduced in comparison with the case of crystallizing the raw material by using a continuous heat treatment, whereby an excellent crystal structure can be formed. The manufacturing method of the present embodiment is effective for forming a thin ferroelectric film with a thickness of 10 to 150 nm. In the case of forming such a thin ferroelectric film, a ferroelectric film having an excellent crystal structure cannot be obtained by crystallization using a continuous heat treatment. Therefore, it is difficult to form a ferroelectric capacitor having electrical characteristics applicable to semiconductor devices such as a ferroelectric memory. However, the present invention enables formation of a thin ferroelectric film having an excellent crystal structure, thereby contributing to an increase in the degree of integration of semiconductor devices.

Moreover, the complex oxide material can be prevented from being released to the atmosphere by the heat treatment in a pressurized and low oxygen concentration state. Therefore, a ferroelectric film having excellent characteristics can be formed, whereby electrical characteristics of the ferroelectric capacitor can be improved.

In the method of manufacturing a ferroelectric capacitor according to the present embodiment, a heat treatment is performed at a temperature higher than the crystallization temperature in the step (a) (hereinafter called "post-annealing") after forming the upper electrode 50 on the substrate 10. As the post-annealing, a heat treatment for recovering the ferroelectric characteristics may be performed at a pressure of two atmospheres or more. The post-annealing may be performed after forming the upper electrode 50 on the substrate 10 and patterning the ferroelectric capacitor by etching or the like.

The post-annealing is performed at a temperature higher than the temperature in the step (a), such as 400 to 700° C. The post-annealing may be performed by slowly heating the ferroelectric capacitor using furnace annealing (FA), or by rapidly heating the ferroelectric capacitor using the rapid thermal annealing method.

A crystal growth from the side of the upper electrode 50 is promoted by performing the post-annealing. Moreover, the interfacial state between the ferroelectric film 40 and the upper electrode 50, and between the ferroelectric film 40 and the lower electrode 20 can be improved. Therefore, the ferroelectric characteristics can be recovered, whereby a ferroelectric film having a further excellent crystal structure can be formed.

The above heat treatment may be performed in an atmosphere such as a gas inert to vaporization of the metal material which makes up the complex oxide, such as nitrogen, argon, or xenon. The effect of preventing vaporization of the metal material which makes up the complex oxide can be further increased by performing the heat treatment in such an atmosphere.

A further detailed example of the manufacturing method according to the present embodiment is described below with reference to the drawings.

EXAMPLE

In Example 1, $Pb(Zr_{0.35},Ti_{0.65})O_3$ was deposited on a given substrate on which a Pt electrode was formed by using a spin coating method to conduct an examination.

In this example, a sol-gel solution adjusted to the stoichiometric composition of PZT (Zr/Ti=35/65) was used as a raw material solution.

Figure 3:
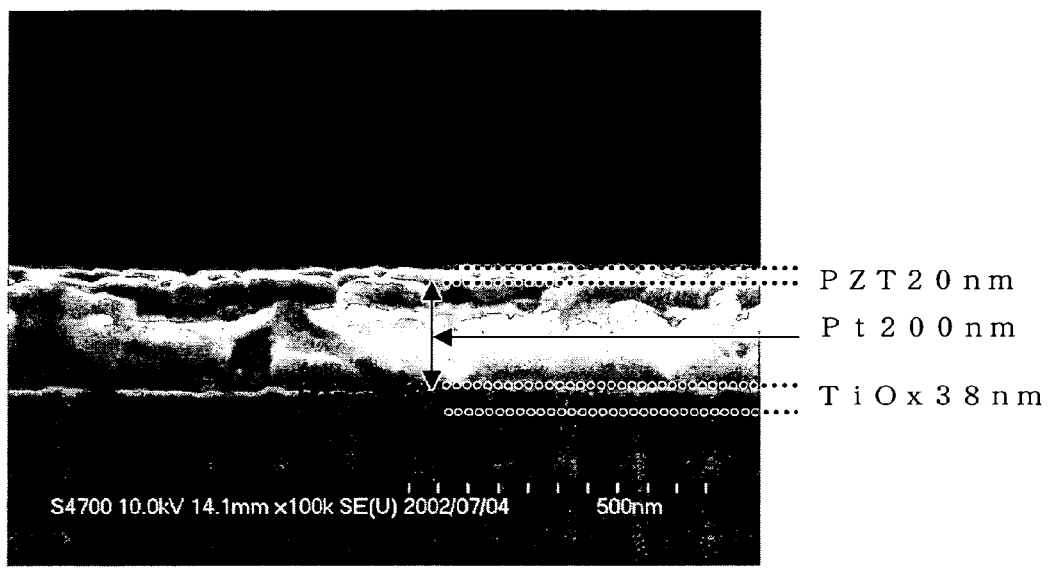
FIG. 3 is a micrograph of the section of a ferroelectric film obtained by using a manufacturing method in an example of this embodiment of the present invention.
Figure 4:
FIG. 4 is a micrograph of the surface of a ferroelectric film obtained by using a manufacturing method in the example of this embodiment of the present invention.

The raw material solution was applied to the Pt electrode by spin coating (5000 rpm, 60 sec) and presintered to form a raw material with a thickness of 20 nm on the Pt electrode. The presintering was performed by heating the raw material at 150° C. for one minute and at 300° C. for one minute. As the step (a), the raw material was heated to 500° C. using furnace annealing (FA) in an atmosphere pressurized at two atmospheres and containing oxygen in an amount of 1% at a volume ratio, and subjected to a heat treatment for 30 minutes. As the step (b), the second condition, in which the pressure was reduced to atmospheric pressure and the temperature was lowered to room temperature, is maintained. The step (a) was then performed again. A PZT film in which the raw material was crystallized was thus obtained. FIG. 3 is a micrograph of the section of the resulting PZT film. As shown in FIG. 3, a thin ferroelectric film is formed on the Pt electrode. FIG. 4 is a micrograph of the surface of the PZT film. As shown in FIG. 4, crystals having a uniform average particle diameter are uniformly distributed to exhibit excellent surface morphology.

In this example, a Pt electrode was formed on the crystallized PZT film as an upper electrode, and post annealing was performed at two atmospheres to obtain a ferroelectric capacitor. The ferroelectric characteristics of the ferroelectric capacitor were then evaluated.

Figure 5:
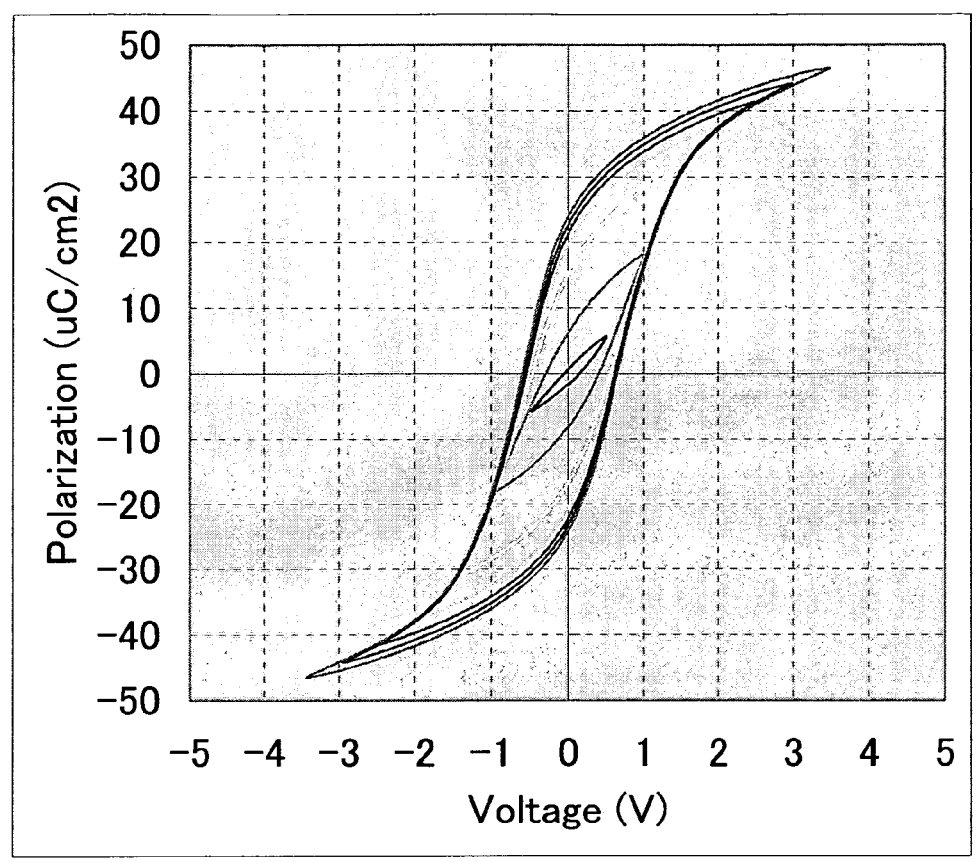
FIG. 5 is a graph showing hysteresis characteristics of a ferroelectric capacitor according to the example of this embodiment of the present invention.

FIG. 5 shows hysteresis characteristics of the ferroelectric capacitor obtained by the manufacturing method of this example. As shown in FIG. 5, a hysteresis shape with excellent squareness saturated at a low voltage of 2 V or less was obtained from the ferroelectric capacitor of this example. As described above, it was confirmed that the ferroelectric capacitor manufactured by the manufacturing method of the present embodiment has excellent hysteresis characteristics and fatigue characteristics.

2. Ferroelectric Memory 2.1 First Ferroelectric Memory

Figure 6:
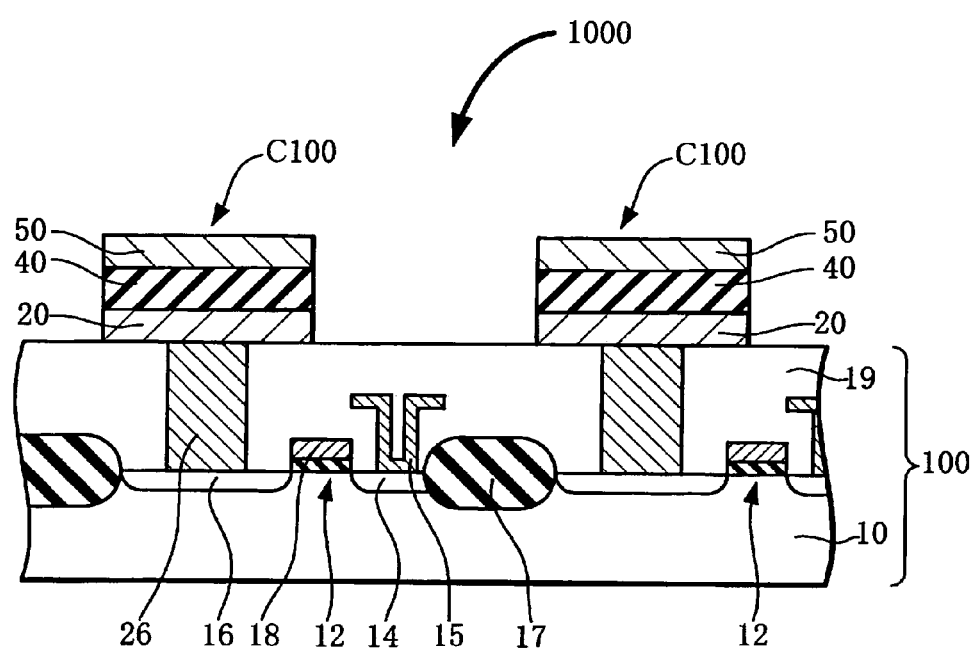
FIG. 6 shows a ferroelectric memory according to an embodiment of the present invention.

FIG. 6 is a cross-sectional view schematically showing a first ferroelectric memory 1000. The first ferroelectric memory 1000 includes a transistor formation region for controlling the ferroelectric memory. The transistor formation region corresponds to the body 100 described in the first embodiment.

The body 100 includes a transistor 12 on a semiconductor substrate 10. The transistor 12 may have a conventional configuration. A thin film transistor (TFT) or MOSFET may be used as the transistor 12. In FIG. 6, a MOSFET is used as the transistor 12. The transistor 12 includes drain/sources 14 and 16 and a gate electrode 18. An electrode 15 is formed on the drain/source 14, and a plug electrode 26 is formed on the drain/source 16. The plug electrode 26 is connected with the first electrode 20 of the ferroelectric capacitor C100 through a barrier layer, if necessary. The memory cells are separated by an element isolation region 17 such as LOCOS or trench isolation. An interlayer dielectric 19 is formed of an insulator, such as silicon oxide, on the semiconductor substrate 10 on which the transistor 12 and the like are formed.

In the above-described configuration, the structure under the ferroelectric capacitor C100 forms the transistor formation region (body 100). In more detail, the transistor formation region is the structure including the transistor 12, the electrodes 15 and 26, the interlayer dielectric 19, and the like formed on the semiconductor substrate 10. The ferroelectric capacitor C100 manufactured by the manufacturing method of the first embodiment is formed on the body 100.

The ferroelectric memory 1000 has a structure of storing a charge as data in a storage capacitor in the same manner as a DRAM cell. Specifically, the memory cell includes the transistor and the ferroelectric capacitor, as shown in FIGS. 7 and 8.

Figure 7:
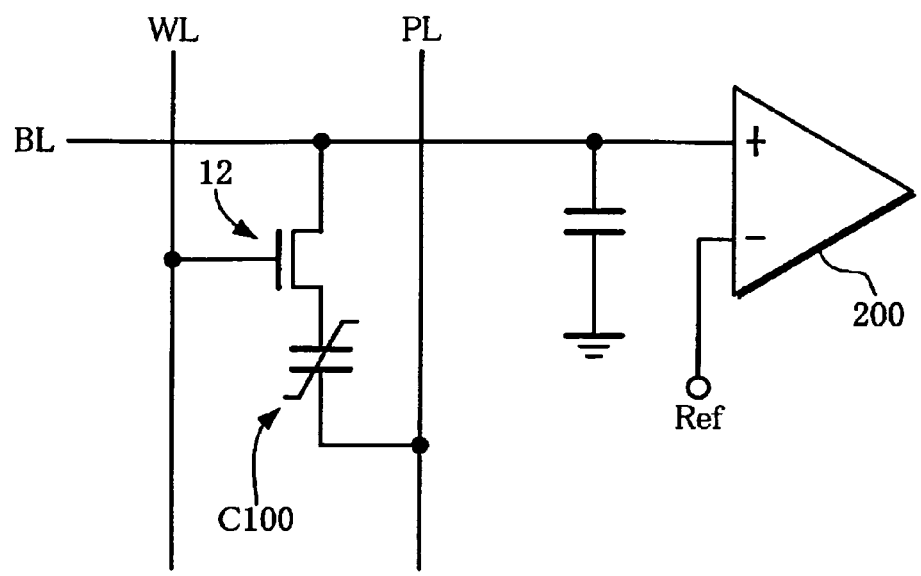
FIG. 7 shows a ferroelectric memory according to an embodiment of the present invention.
Figure 8:
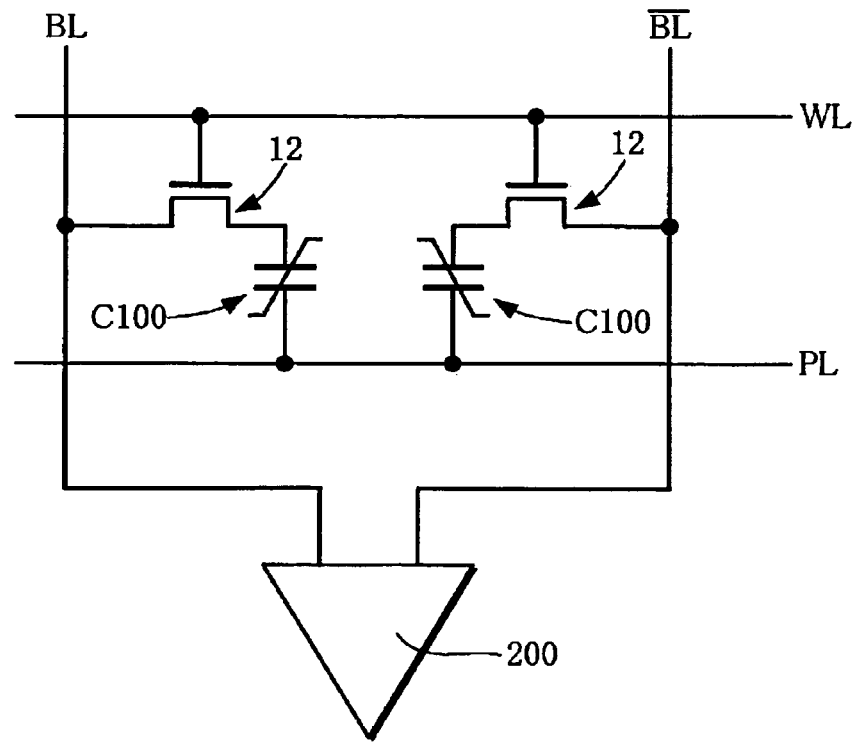
FIG. 8 shows a ferroelectric memory according to an embodiment of the present invention.

FIG. 7 shows a 1T1C cell type ferroelectric memory in which the memory cell includes one transistor 12 and one ferroelectric capacitor C100. The memory cell is located at the intersecting point of a wordline WL and a bitline BL. One end of the ferroelectric capacitor C100 is connected with the bitline through the transistor 12 which connects and disconnect the connection with the bitline BL. The other end of the ferroelectric capacitor C100 is connected with a plate line PL. A gate of the transistor 12 is connected with the wordline WL. The bitline BL is connected with a sense amplifier 200 which amplifies a signal charge.

An example of the operation of the 1T1C cell is described below briefly.

In the read operation, the bitline BL is set at 0 V, and the transistor 12 is turned ON by applying a voltage to the wordline WL. The amount of polarization charge corresponding to the data stored in the ferroelectric capacitor C100 is transmitted to the bitline BL by increasing the voltage applied to the plate line PL from 0 V to about a power supply voltage $V_{CC}$. The stored data can be read as $V_{CC}$ or 0 V by amplifying a small potential change generated by the amount of polarization charge by using the differential sense amplifier 200.

In the write operation, the transistor 12 is turned ON by applying a voltage to the wordline WL, and a voltage is applied between the bitline BL and the plate line PL, whereby the polarization state of the ferroelectric capacitor C100 is changed and determined.

FIG. 8 shows a 2T2C cell type memory cell in which the memory cell includes two transistors 12 and two ferroelectric capacitors C100. The 2T2C cell has a structure for retaining complementary data by combining two 1T1C cells described above. Specifically, in the 2T2C cell, data is detected by inputting complementary signals from two memory cells, in which data is written complementarily as two differential inputs, to the sense amplifier 200. Therefore, since the data is written in two ferroelectric capacitors C100 in the 2T2C cell the same number of times, the deterioration state of the ferroelectric films of ferroelectric capacitors C100 becomes equal, whereby a stable operation can be achieved.

2.2 Second Ferroelectric Memory

Figure 9:
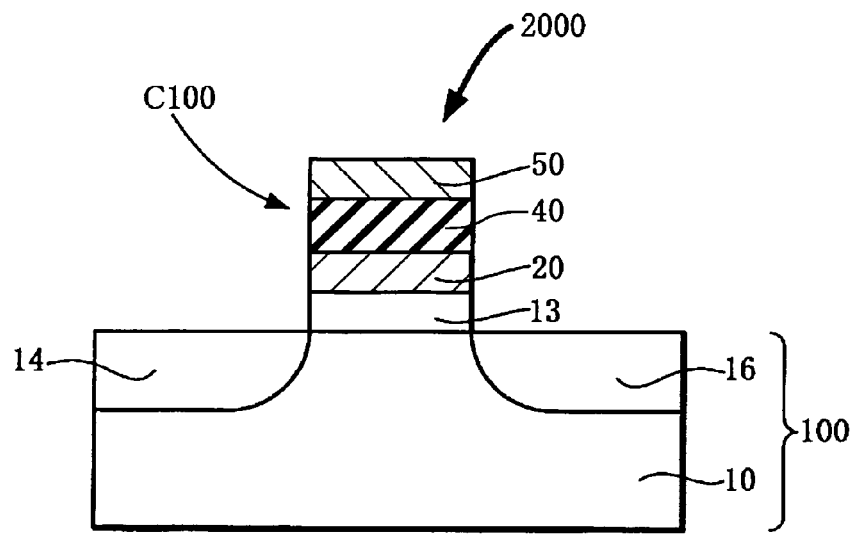
FIG. 9 shows a ferroelectric memory according to an embodiment of the present invention.
Figure 10:
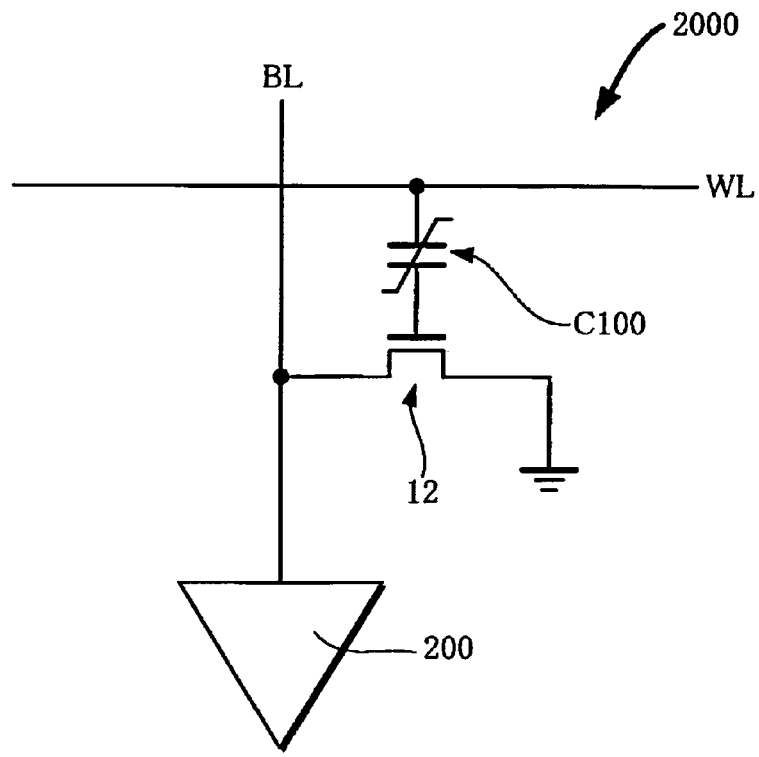
FIG. 10 shows a ferroelectric memory according to an embodiment of the present invention.

FIGS. 9 and 10 show a ferroelectric memory 2000 including a MIS transistor type memory cell. The ferroelectric memory 2000 has a structure in which the ferroelectric capacitor C100 is directly connected to the gate insulating layer 13. In more detail, source/drains 14 and 16 are formed in the semiconductor substrate 10. The ferroelectric capacitor C100 formed by stacking the floating gate electrode (lower electrode) 20, the ferroelectric film 40 according to the present invention, and the gate electrode (upper electrode) 50 is connected to the gate insulating layer 13. As the ferroelectric film 40, a ferroelectric film formed by applying the manufacturing method of the first embodiment is used. In the ferroelectric memory 2000, the semiconductor substrate 10, the source/drains 14 and 16, and the gate insulating layer 13 correspond to the body 100 described in the first embodiment.

In the ferroelectric memory 2000, the wordline WL is connected with the gate electrode 50 of each cell, and the drain is connected with the bitline BL, as shown in FIG. 10. In this ferroelectric memory, the data write operation is performed by applying an electric field between the wordline WL and the well (source) of the selected cell. The read operation is performed by selecting the wordline WL corresponding to the selected cell and detecting the amount of current flowing through the transistor using the sense amplifier 200 connected with the bitline BL of the selected cell.

2.3 Third Ferroelectric Memory

Figure 11:
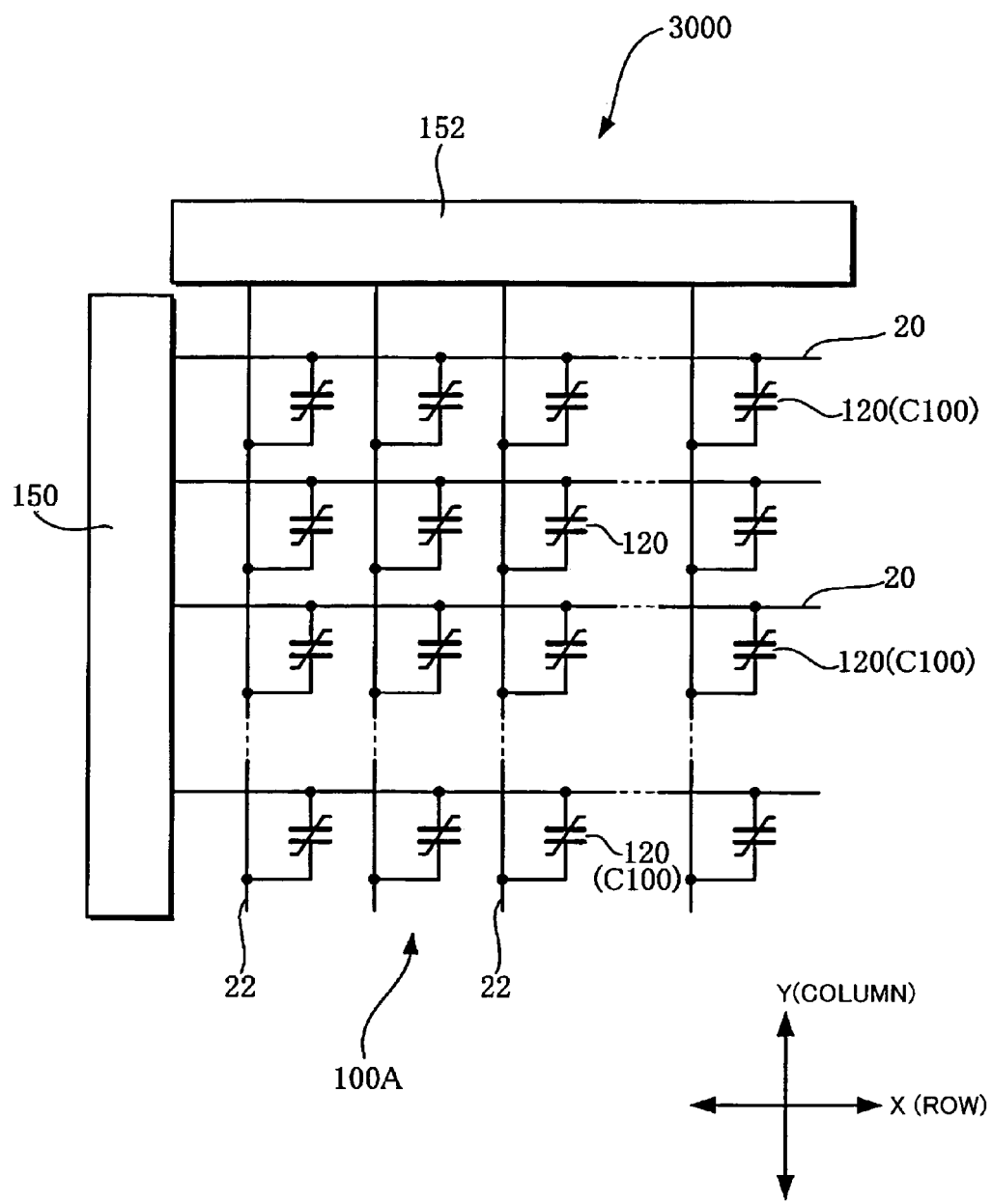
FIG. 11 shows a ferroelectric memory according to an embodiment of the present invention.
Figure 12:
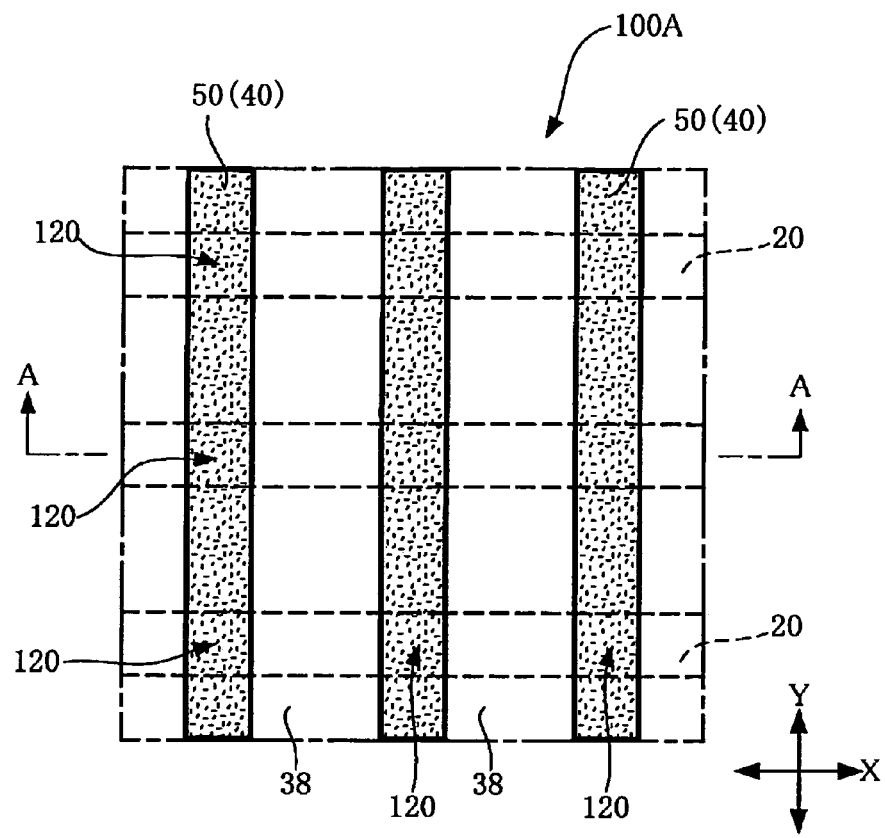
FIG. 12 shows a ferroelectric memory according to an embodiment of the present invention.
Figure 13:
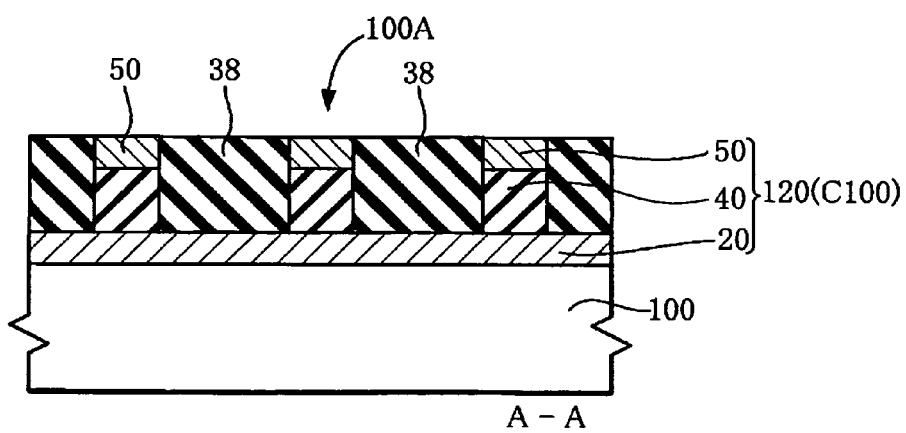
FIG. 13 shows a ferroelectric memory according to an embodiment of the present invention.

FIG. 11 is a view schematically showing a third ferroelectric memory. FIG. 12 is an enlarged plan view showing a part of a memory cell array. FIG. 13 is a cross-sectional view along the line A—A shown in FIG. 11. In the plan view, a numeral in parentheses indicates a layer lower than the uppermost layer.

As shown in FIG. 11, a ferroelectric memory device 3000 in this example includes a memory cell array 100A in which memory cells 120 are arranged in the shape of a simple matrix, and various circuits for selectively writing or reading data in or from the memory cell 120 (ferroelectric capacitor C100), such as a first driver circuit 150 for selectively controlling the first signal electrode (lower electrode) 20, a second driver circuit 152 for selectively controlling the second signal electrode (upper electrode) 50, and a signal detection circuit (not shown) such as a sense amplifier.

In the memory cell array 100A, the first signal electrodes 20 for selecting the row and the second signal electrodes 50 for selecting the column are arranged to intersect at right angles. Specifically, the first signal electrodes 20 are arranged at a specific pitch along the X direction. The second signal electrodes 50 are arranged at a specific pitch along the Y direction which intersects the X direction at right angles. The first signal electrode may be the bitline and the second signal electrode may be the wordline, differing from the above example.

In the memory cell array 100A according to the present embodiment, the first signal electrode 20, the ferroelectric film 40 according to the present invention, and the second signal electrode 50 are stacked on the insulating body 100, as shown in FIGS. 12 and 13. The first signal electrode 20, the ferroelectric layer 30 formed by applying the manufacturing method of the first embodiment, and the second signal electrode 50 make up the ferroelectric capacitor 120. Specifically, a memory cell including the ferroelectric capacitor 120 is formed in the intersecting region of the first signal electrode 20 and the second signal electrode 50.

A dielectric layer 38 is formed between the laminates formed of the ferroelectric film 40 and the second signal electrode 50 so as to cover the exposed surfaces of the body 100 and the first signal electrode 20. The dielectric layer 38 preferably has a dielectric constant lower than the dielectric constant of the ferroelectric film 40. The floating capacitance of the first and second signal electrodes 20 and 50 can be reduced by allowing the dielectric layer 38 having a dielectric constant lower than that of the ferroelectric film 40 to be present between the laminates formed of the ferroelectric film 40 and the second signal electrode 50. As a result, read and write operations of the ferroelectric memory 3000 can be performed at a higher speed.

An example of the read and write operations of the ferroelectric memory 3000 is described below.

In the read operation, a read voltage "$V_0$" is applied to the capacitor in the selected cell. This also serves as a write operation of data "0". At this time, current flowing through the selected bitline or a potential when causing the bitline to be in a high impedance state is read by using the sense amplifier. A predetermined voltage is applied to the capacitors in the unselected cells in order to prevent occurrence of crosstalk during reading.

In the write operation, in the case of writing data "1", a voltage "$-V_0$" is applied to the capacitor in the selected cell. In the case of writing data "0", a voltage which does not cause polarization reversal of the selected cell is applied to the capacitor in the selected cell, whereby the "0" state written during the read operation is retained. A predetermined voltage is applied to the capacitors in the unselected cells in order to prevent occurrence of crosstalk during writing.

According to the ferroelectric memory of the present invention, since the ferroelectric memory includes a ferroelectric capacitor including a ferroelectric film having excellent crystal structure, a highly reliable ferroelectric memory can be provided. Examples of the storage capacitance type, MIS transistor type, and simple matrix type ferroelectric memories are described above. However, the ferroelectric memory of the present invention is not limited thereto. The ferroelectric memory of the present invention may be applied to other types of memory transistors. The ferroelectric capacitor of the present embodiment may be applied to a pyroelectric sensor and a bimorph piezo actuator in addition to the ferroelectric memory described above.

What is claimed is:

1. A method of manufacturing a ferroelectric film including crystallizing a raw material including a complex oxide, the method comprising:
   performing a heat treatment in a first condition in which a predetermined pressure and a predetermined temperature are applied; and
   maintaining a second condition, in which a pressure and a temperature lower than the pressure and the temperature in the first condition are applied, after the heat treatment in the first condition,
   wherein the raw material is crystallized by repeating the heat treatment in the first condition and the maintaining the second condition.

2. The method of manufacturing a ferroelectric film as defined in claim 1,
   wherein the heat treatment in the first condition is performed at a pressure at two atmospheres or more and in an atmosphere containing oxygen at a volume ratio of 10% or less.

3. The method of manufacturing a ferroelectric film as defined in claim 1,
   wherein the heat treatment in the first condition is performed at a pressure of two atmospheres or more using a rapid thermal annealing method.

4. The method of manufacturing a ferroelectric film as defined in claim 3,
   wherein the heat treatment in the first condition is performed in an atmosphere containing oxygen at a volume ratio of 10% or less.

5. The method of manufacturing a ferroelectric film as defined in claim 1,
   wherein the heat treatment in the first condition includes applying a pressure at two atmospheres or more at least before raising a temperature.

6. A method of manufacturing a ferroelectric capacitor, comprising:
   forming a lower electrode on a body;
   forming a ferroelectric film on the lower electrode by crystallizing a raw material including a complex oxide; and
   forming an upper electrode on the ferroelectric film,
   wherein the crystallization includes:
   performing a first heat treatment in a first condition in which a predetermined pressure and a predetermined temperature are applied; and
   maintaining a second condition, in which a pressure and a temperature lower than the pressure and the temperature in the first condition are applied, after the heat treatment in the first condition,
   wherein the heat treatment in the first condition and the maintaining the second condition are repeated.

7. The method of manufacturing a ferroelectric film as defined in claim 6,
   wherein the first heat treatment in the first condition is performed at a pressure at two atmospheres or more and in an atmosphere containing oxygen at a volume ratio of 10% or less.

8. The method of manufacturing a ferroelectric film as defined in claim 6,
   wherein the first heat treatment in the first condition is performed at a pressure of two atmospheres or more using a rapid thermal annealing method.

9. The method of manufacturing a ferroelectric film as defined in claim 8, wherein the first heat treatment in the first condition is performed in an atmosphere containing oxygen at a volume ratio of 10% or less.

10. The method of manufacturing a ferroelectric film as defined in claim 6,
wherein the first heat treatment in the first condition includes applying a pressure at two atmospheres or more at least before raising a temperature.

11. The method of manufacturing a ferroelectric capacitor as defined in claim 6,
wherein a second heat treatment, in which a temperature higher than the temperature in the first condition is applied, is performed at least after forming the upper electrode.

12. The method of manufacturing a ferroelectric capacitor as defined in claim 11,
wherein the second heat treatment is performed at a pressure of two atmospheres or more.

13. The method of manufacturing a ferroelectric capacitor as defined in claim 11,
wherein the second heat treatment is performed by using a rapid thermal annealing method.

14. The method of manufacturing a ferroelectric capacitor as defined in claim 11,
wherein the second heat treatment is performed in an atmosphere containing oxygen at a volume ratio of 10% or less.

* * * * *